United States Patent
Lee

(10) Patent No.: US 9,973,617 B2
(45) Date of Patent: May 15, 2018

(54) MOBILE TERMINAL AND CONTROL METHOD THEREOF

(71) Applicant: LG ELECTRONICS INC., Seoul (KR)

(72) Inventor: Heungkyu Lee, Seoul (KR)

(73) Assignee: LG ELECTRONICS INC., Seoul (KR)

( * ) Notice: Subject to any disclaimer, the term of this patent is extended or adjusted under 35 U.S.C. 154(b) by 0 days. days.

(21) Appl. No.: 15/312,606

(22) PCT Filed: Aug. 19, 2014

(86) PCT No.: PCT/KR2014/007660
§ 371 (c)(1),
(2) Date: Nov. 18, 2016

(87) PCT Pub. No.: WO2015/199279
PCT Pub. Date: Dec. 30, 2015

(65) Prior Publication Data
US 2017/0099380 A1    Apr. 6, 2017

(30) Foreign Application Priority Data

Jun. 24, 2014 (KR) .......... 10-2014-0077605

(51) Int. Cl.
*H04M 1/725* (2006.01)
*G06F 3/16* (2006.01)
*H04W 88/02* (2009.01)

(52) U.S. Cl.
CPC ........ *H04M 1/72569* (2013.01); *G06F 3/165* (2013.01); *H04M 2250/12* (2013.01); *H04W 88/02* (2013.01)

(58) Field of Classification Search
CPC combination set(s) only.
See application file for complete search history.

(56) References Cited

U.S. PATENT DOCUMENTS 7,907,738 B2 * 3/2011 King ............ H03G 5/005
381/103
2002/0149704 A1 * 10/2002 Kano ............ G08C 17/00
348/706

(Continued)

FOREIGN PATENT DOCUMENTS

| JP | 2000209698 | 7/2000 |
| JP | 2005051320 | 2/2005 |

(Continued)

OTHER PUBLICATIONS

PCT International Application No. PCT/KR2014/007660, Written Opinion of the International Searching Authority dated Feb. 25, 2015, 12 pages.

(Continued)

*Primary Examiner* — Cindy Trandai
(74) *Attorney, Agent, or Firm* — Lee, Hong, Degerman, Kang & Waimey

(57) ABSTRACT

A mobile terminal is disclosed. The mobile terminal comprises a sound output unit; a display unit displaying a plurality of level objects enabling the user to select a frequency gain predetermined according to the user's age in a sound setting mode; a microphone receiving external noise; and a controller outputting through the sound output unit a sound adjusted with a gain obtained as a summation of a gain adjusted in accordance with a selected level object and a gain adjusted in accordance with the level of input noise.

11 Claims, 15 Drawing Sheets

(56) References Cited

U.S. PATENT DOCUMENTS

| | | | |
|---|---|---|---|
| 2005/0069153 A1* | 3/2005 | Hall | H03G 5/025 381/103 |
| 2005/0201572 A1* | 9/2005 | Lindahl | H03G 5/165 381/103 |
| 2005/0244022 A1* | 11/2005 | Muthuswamy | H04M 1/03 381/315 |
| 2007/0085157 A1 | 4/2007 | Fadell et al. | |
| 2008/0181424 A1* | 7/2008 | Schulein | H03G 7/002 381/74 |
| 2009/0192707 A1* | 7/2009 | Nakatsuka | G01C 21/3629 701/431 |
| 2009/0245539 A1* | 10/2009 | Vaudrey | H03G 7/002 381/109 |
| 2010/0060350 A1* | 3/2010 | Zhang | H03H 11/1286 327/553 |
| 2010/0080396 A1* | 4/2010 | Aoyagi | H04S 1/005 381/17 |
| 2010/0266153 A1* | 10/2010 | Gobeli | H04R 3/04 381/321 |
| 2011/0135103 A1* | 6/2011 | Sun | H04R 29/00 381/58 |
| 2011/0235807 A1* | 9/2011 | Hayashi | H04R 5/04 381/17 |
| 2011/0274284 A1* | 11/2011 | Mulder | G10K 11/178 381/72 |
| 2012/0070008 A1* | 3/2012 | Sohn | H04R 25/356 381/23.1 |
| 2012/0157114 A1 | 6/2012 | Alameh et al. | |
| 2013/0053102 A1* | 2/2013 | Inagaki | H04R 3/12 455/557 |
| 2013/0279709 A1 | 10/2013 | Suzuki et al. | |
| 2014/0016795 A1* | 1/2014 | Melamed | H04R 3/00 381/74 |
| 2014/0194775 A1* | 7/2014 | Van Hasselt | A61B 5/123 600/559 |
| 2014/0314261 A1* | 10/2014 | Selig | H04R 25/50 381/314 |
| 2015/0051657 A1* | 2/2015 | Kilgard | A61N 1/37235 607/3 |
| 2015/0119136 A1* | 4/2015 | Kulavik | A63F 13/212 463/29 |
| 2015/0181338 A1* | 6/2015 | Hosoi | H04R 5/033 381/309 |
| 2015/0193196 A1* | 7/2015 | Lin | G06F 3/165 715/716 |
| 2015/0215710 A1* | 7/2015 | Francart | H04R 25/356 381/326 |
| 2015/0281853 A1* | 10/2015 | Eisner | H04R 25/505 381/312 |

FOREIGN PATENT DOCUMENTS

| | | |
|---|---|---|
| JP | 2009267877 | 11/2009 |
| JP | 2012074913 | 4/2012 |
| JP | 5151762 | 2/2013 |
| JP | 2013034057 | 2/2013 |
| KR | 20060091859 | 8/2006 |
| KR | 20080107087 | 12/2008 |
| KR | 20100132214 | 12/2010 |
| KR | 20140071846 | 6/2014 |

OTHER PUBLICATIONS

European Patent Office Application Serial No. 14895918.2, Search Report dated Oct. 17, 2017, 14 pages.
European Patent Office Application Serial No. 14895918.2, Search Report dated Jan. 17, 2018, 14 pages.

* cited by examiner

【Figure 1a】
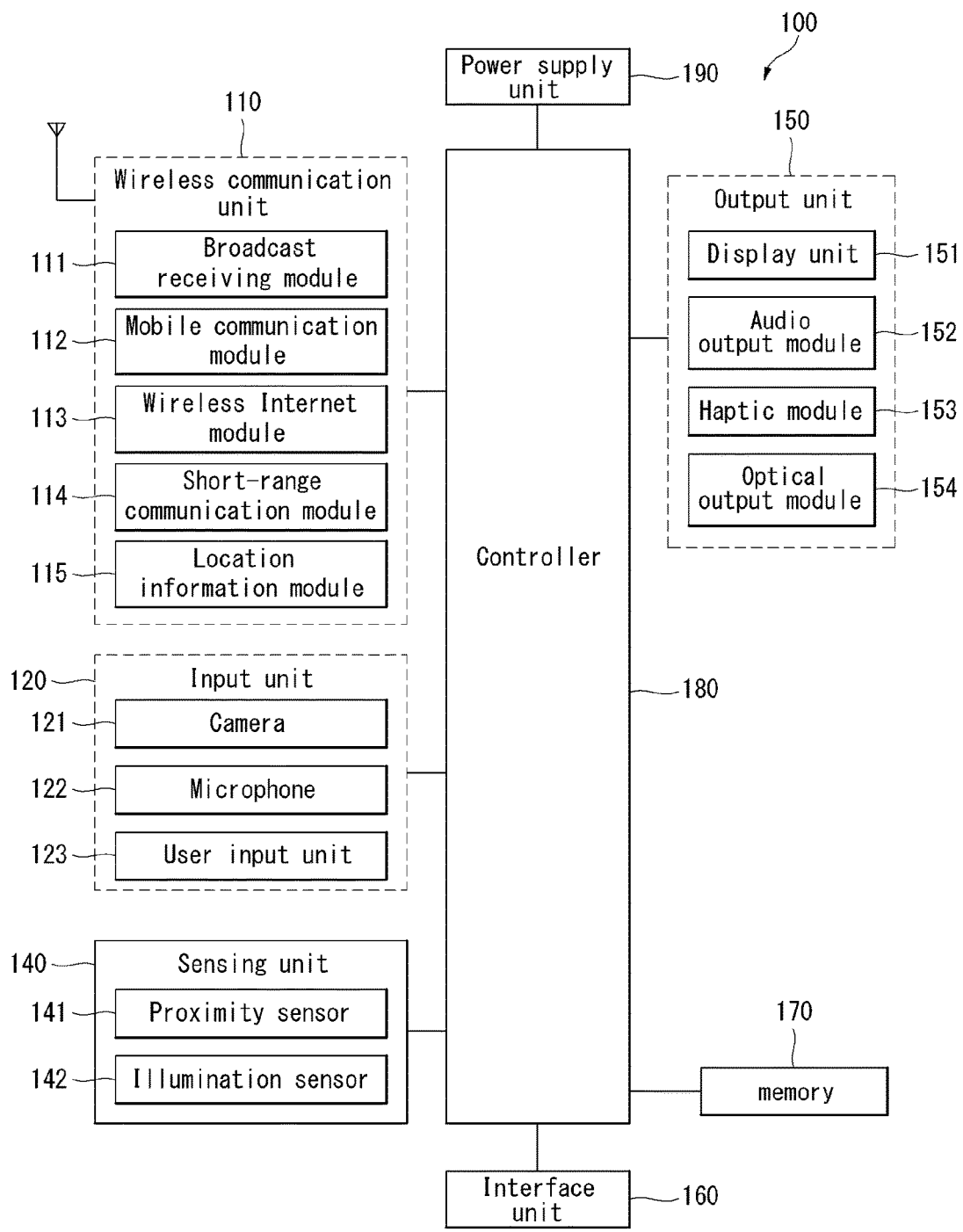

【Figure 1b】
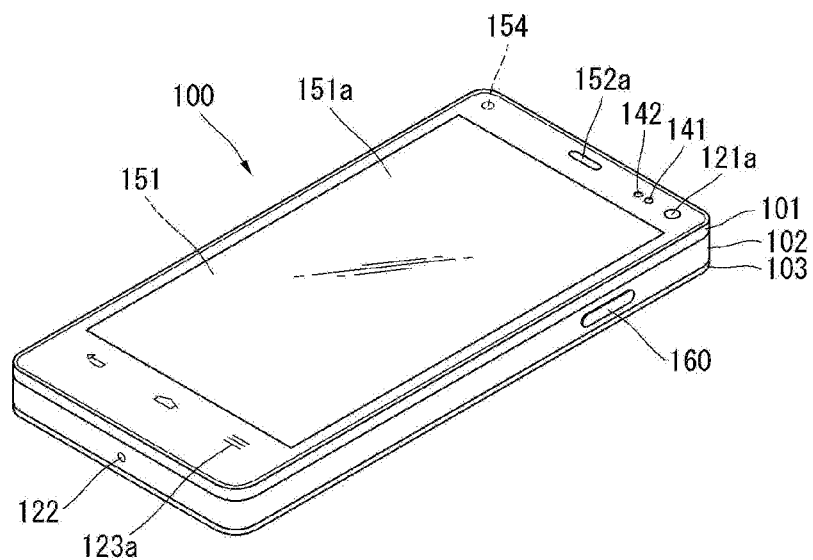
【Figure 1c】
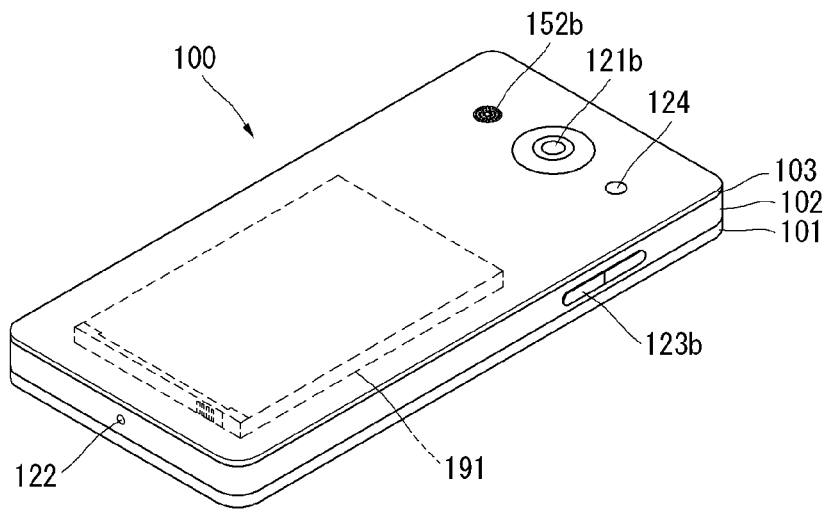

【Figure 2】
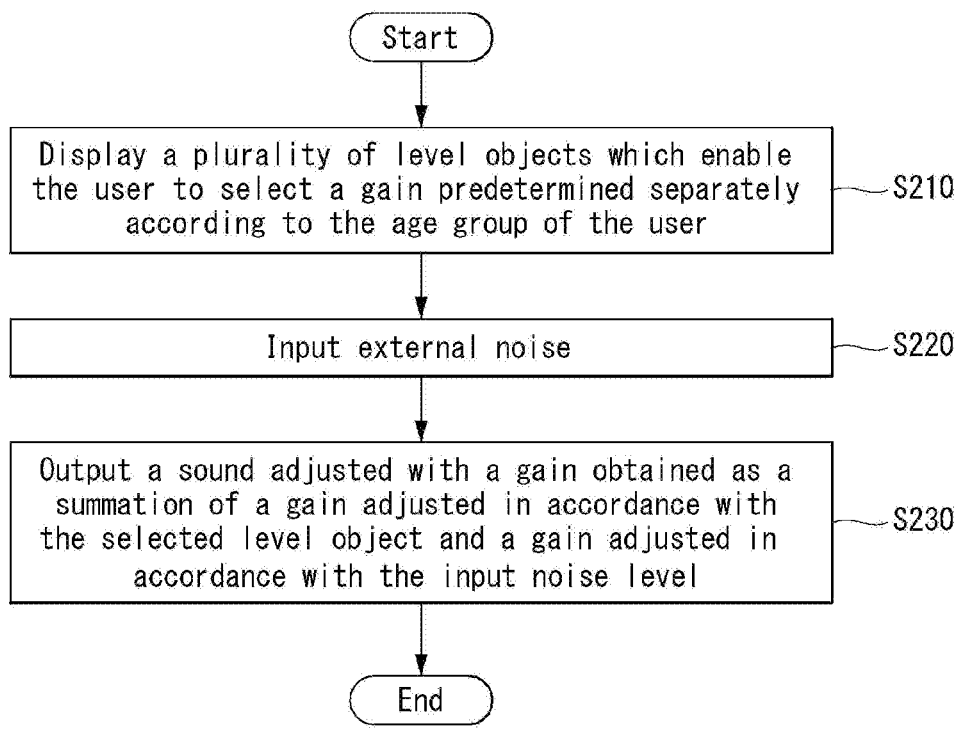

【Figure 3】
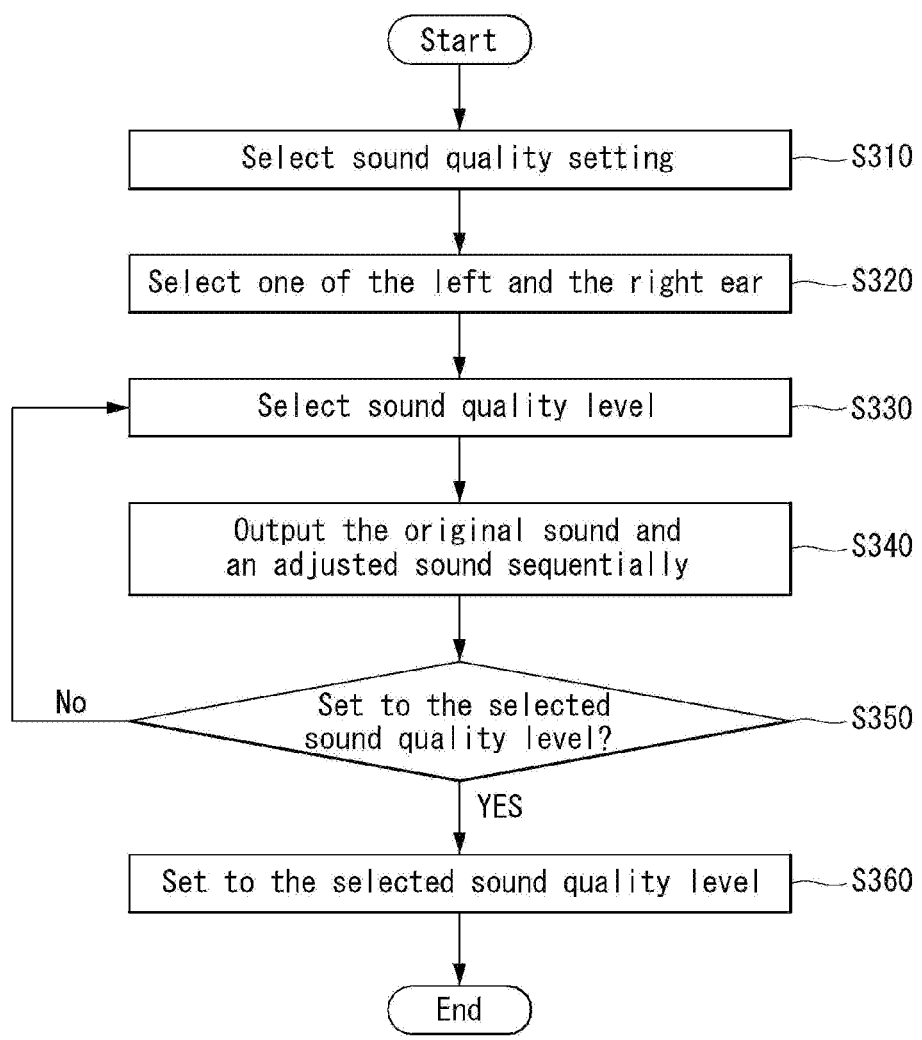

【Figure 4】
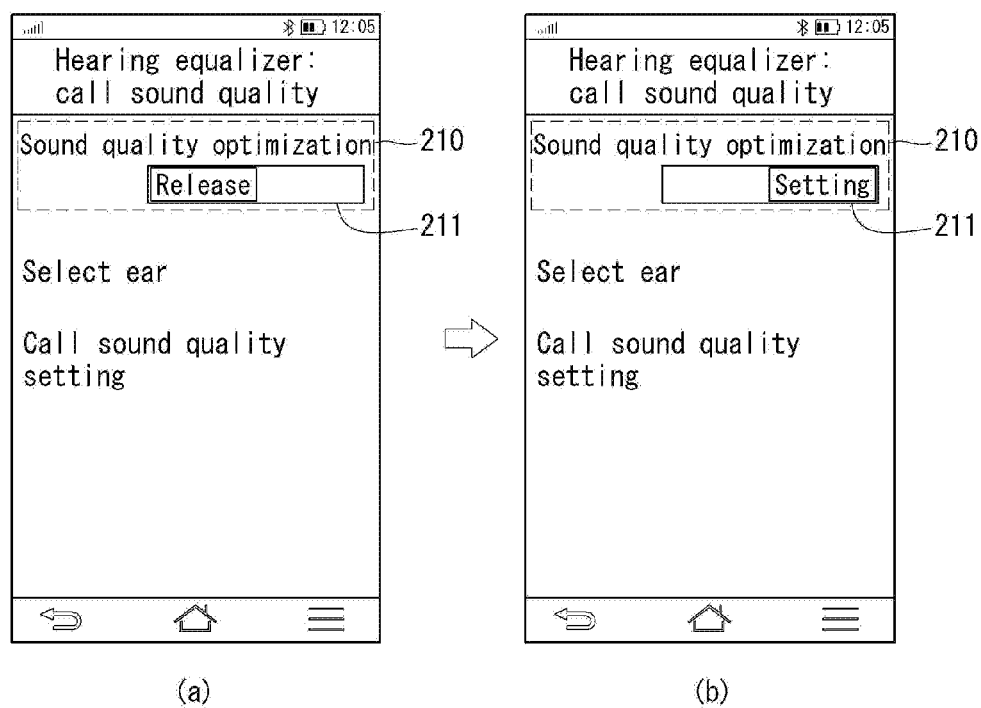

【Figure 5】
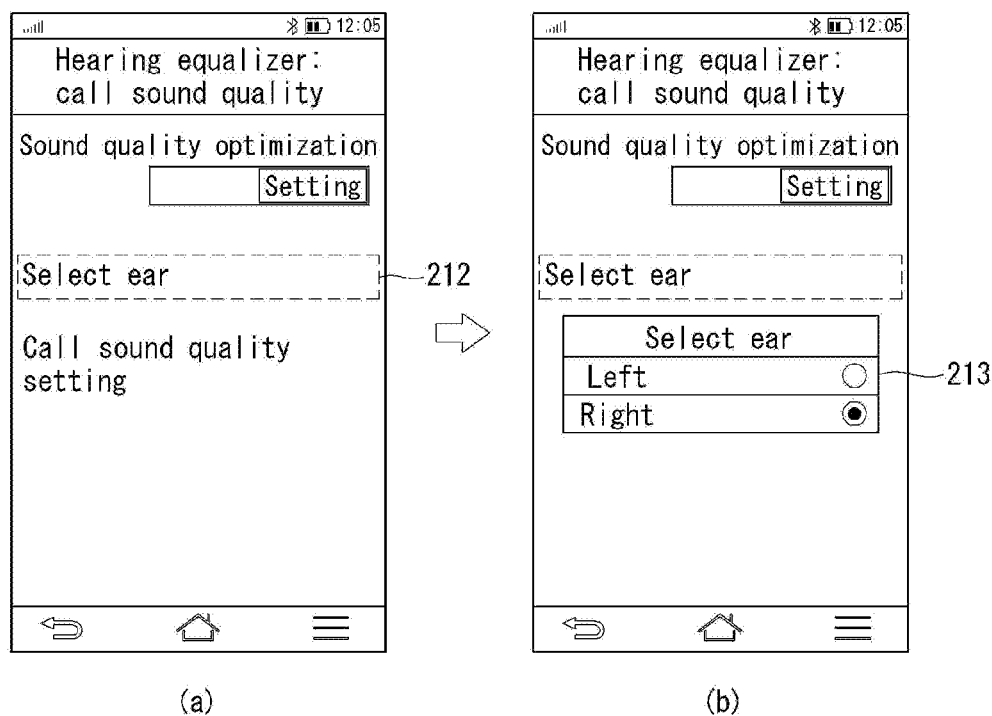

【Figure 6】
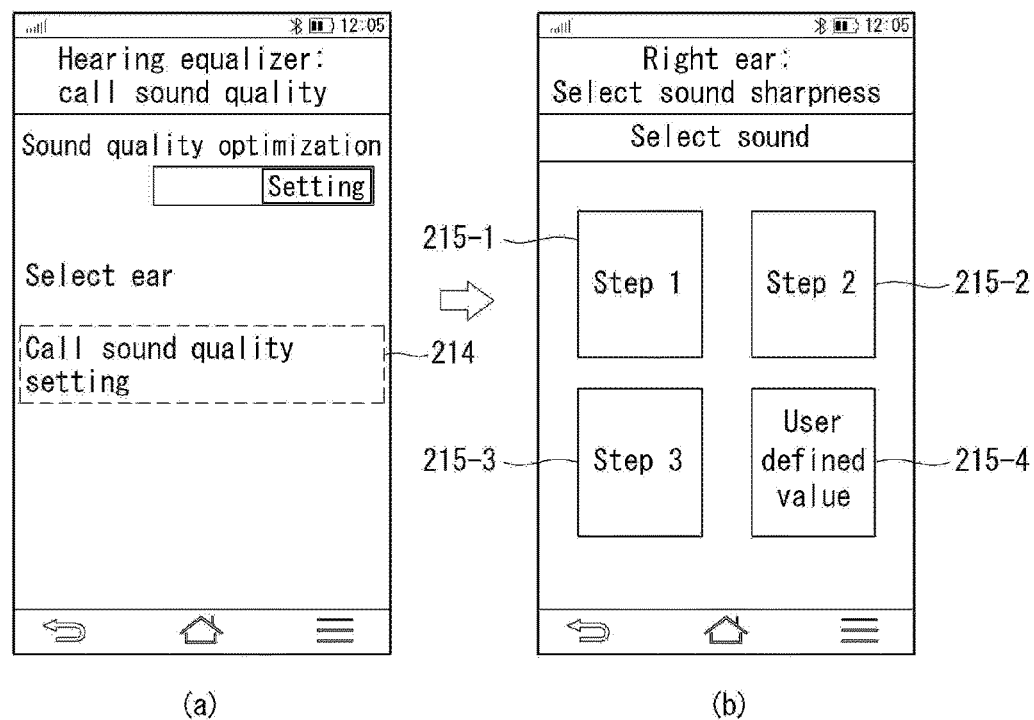

【Figure 7】
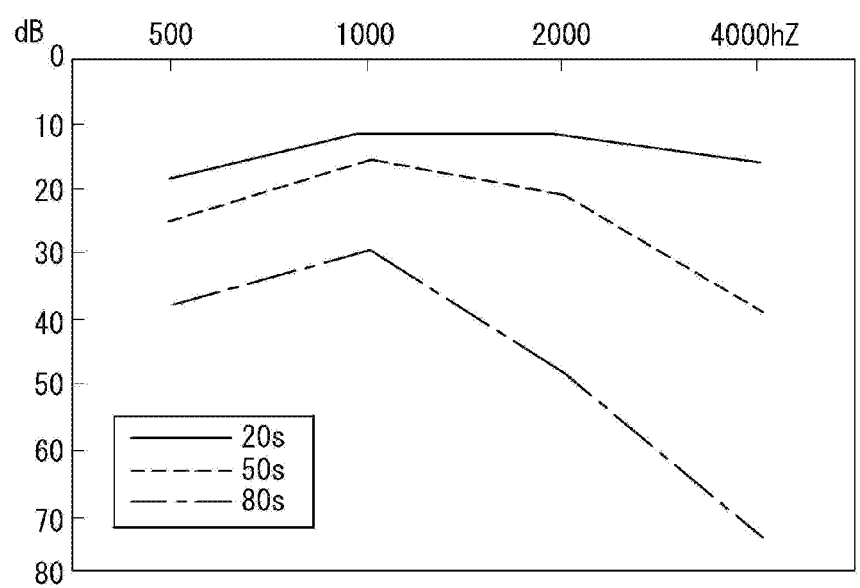

【Figure 8】
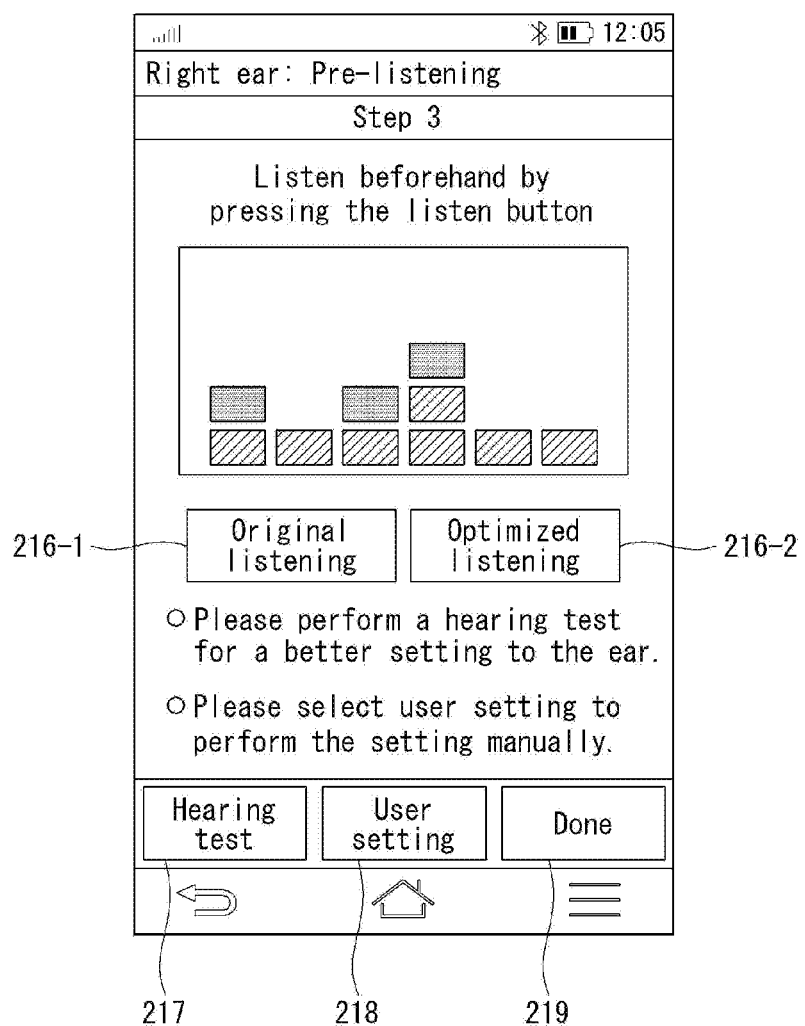

[Figure 9]
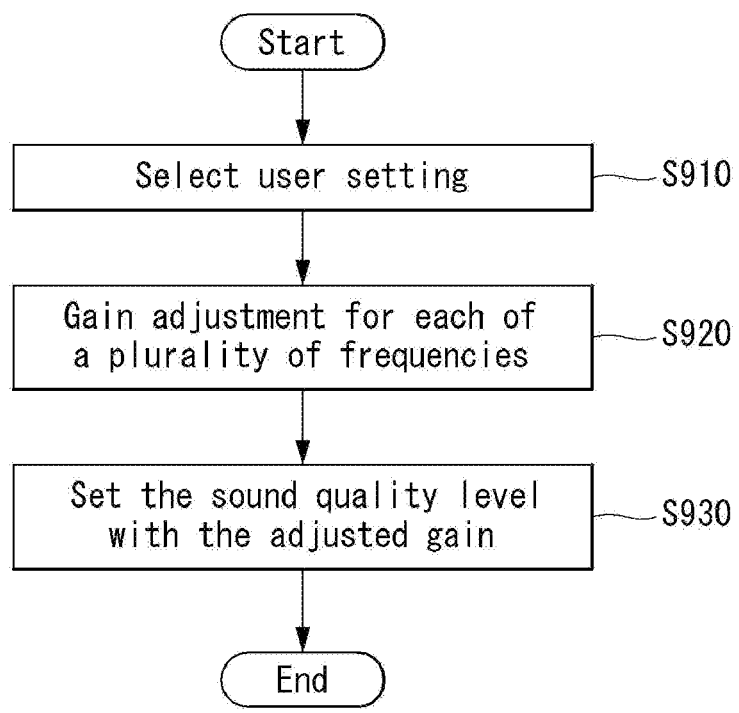

【Figure 10】
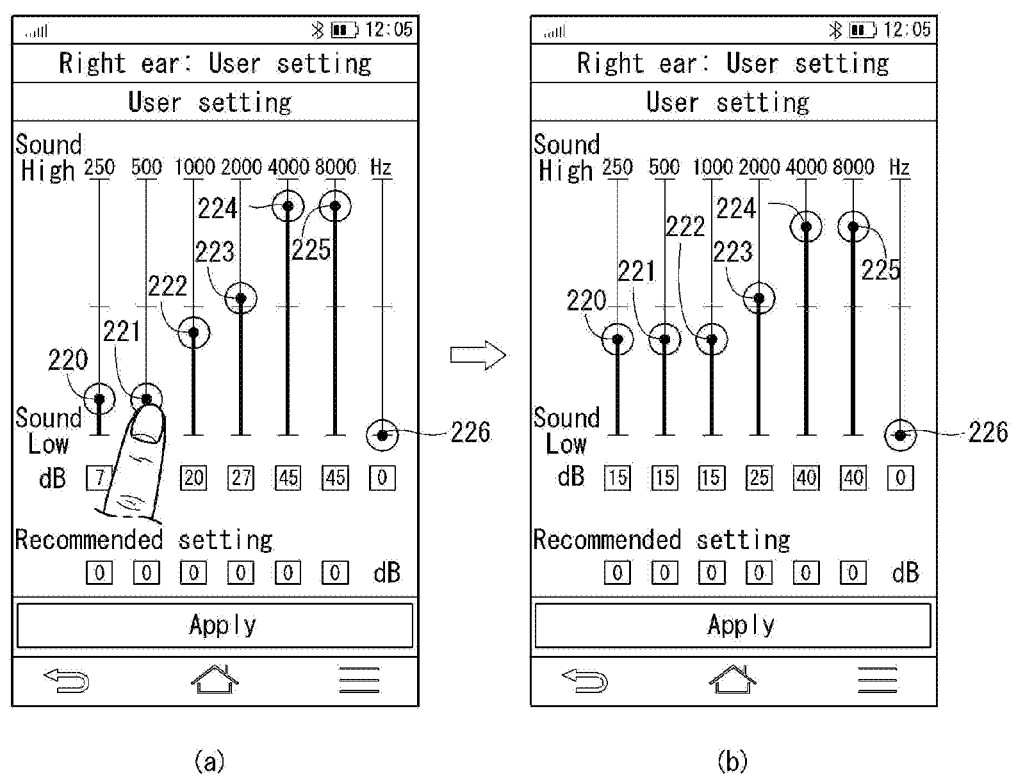
(a)  (b)

【Figure 11】
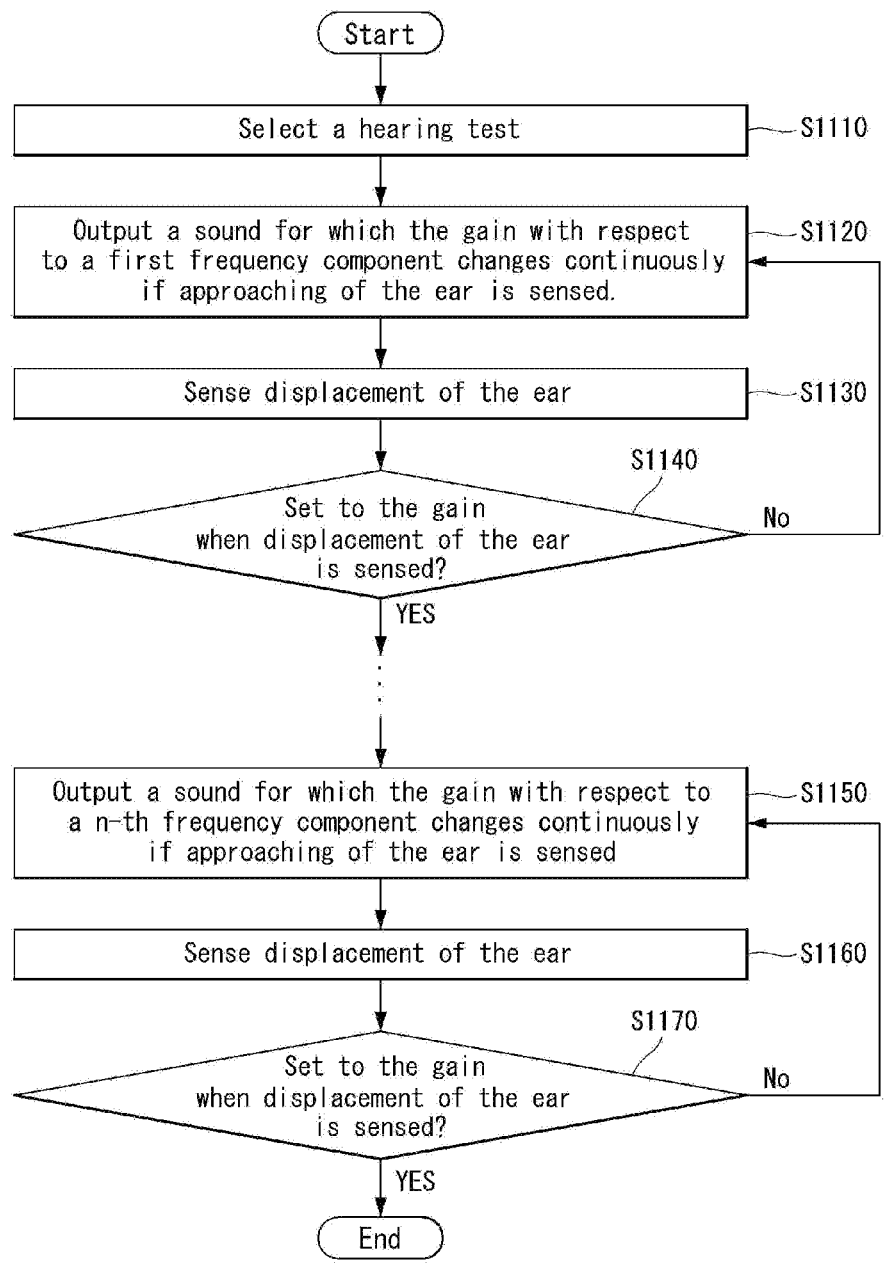

【Figure 12】
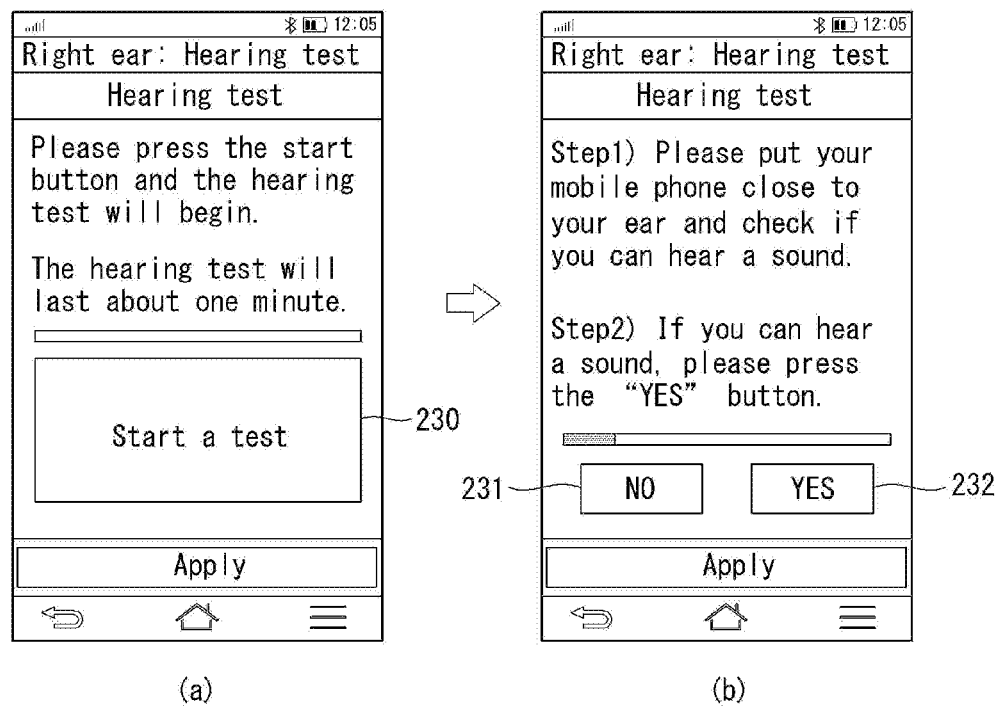

【Figure 13】
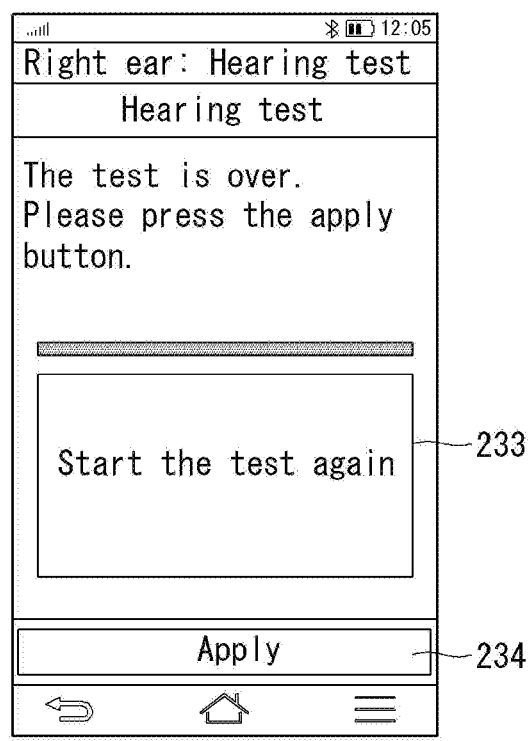

【Figure 14】
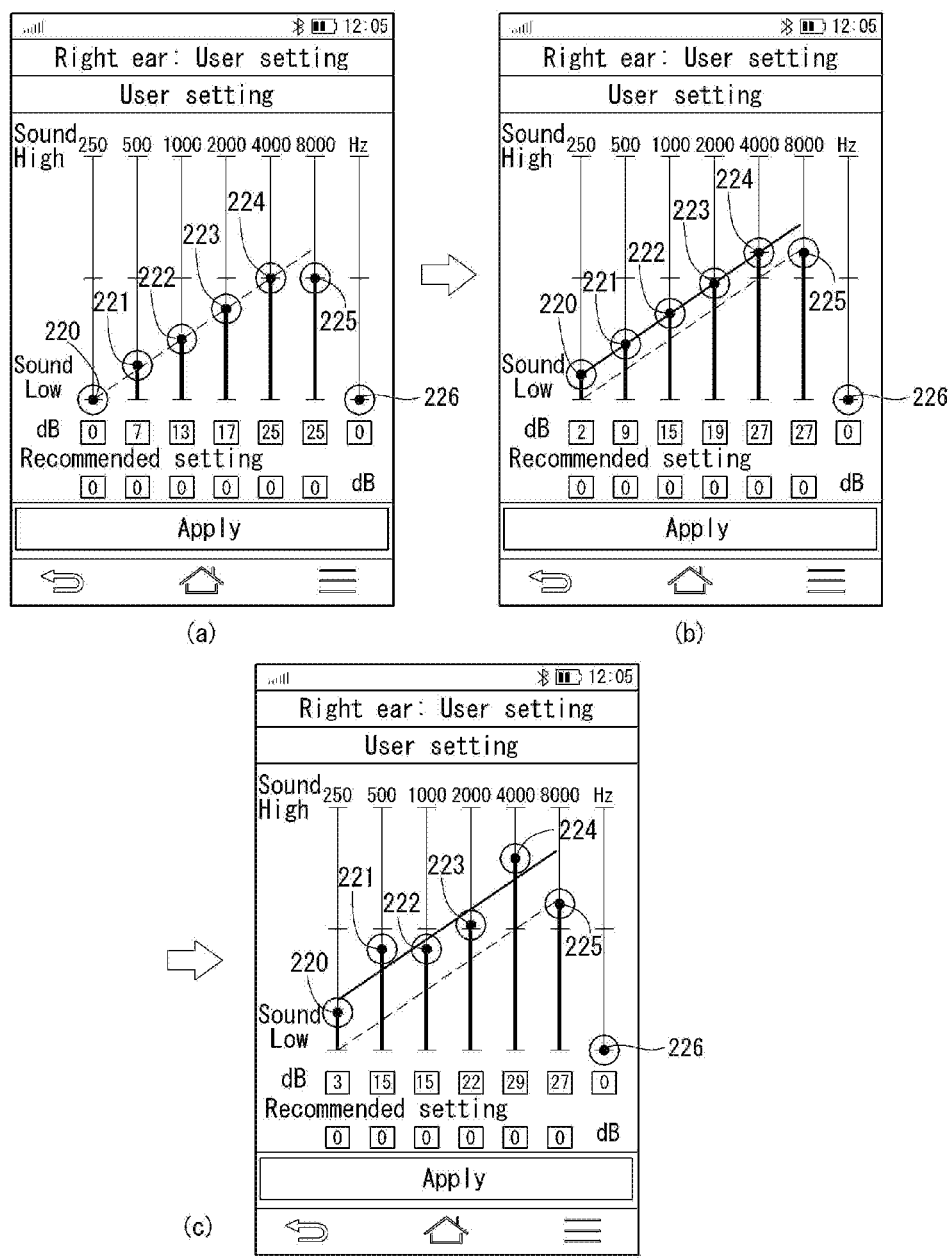

MOBILE TERMINAL AND CONTROL METHOD THEREOF

CROSS-REFERENCE TO RELATED APPLICATIONS

This application is the National Stage filing under 35 U.S.C. 371 of International Application No. PCT/KR2014/007660, filed on Aug. 19, 2014, which claims the benefit of earlier filing date and right of priority to Korean Application No. 10-2014-0077605, filed on Jun. 24, 2014, the contents of which are all hereby incorporated by reference herein in their entirety.

TECHNICAL FIELD

The present invention relates to a mobile terminal generating a sound corresponding to a selected level and a method for controlling the terminal.

BACKGROUND ART

Terminals can be divided into mobile/portable terminals and stationary terminals depending on their mobility. Mobile terminals can be further divided into handheld terminals and vehicle mounted terminals depending on whether they can be carried directly by users.

Functions of mobile terminals are diversified. For example, mobile terminals of today are equipped with functions of data and voice communication, image and video capture through a camera, voice recording, playback of music files through a speaker system, and displaying an image or a video on a display unit. Some mobile terminals are equipped with a function of playing electronic games or capable of carrying out a function of a multimedia player. In particular, mobile terminal of recent model are capable of receiving multi-cast signals providing visual content such as a broadcasting, video, or television program.

DISCLOSURE

Technical Problem

A mobile terminal of the aforementioned type often generates sounds, where quality of an output sound needs to be optimized for the user of the terminal. A conventional method to this end is adapted to earphones so that sound quality thereof is optimized to the user. However, since such a method deals only with a sound output through earphones, the method cannot be applied to sound outputs through speakers.

Moreover, since the conventional method requires considerable time to optimize sound quality for the user, the user often gives up sound optimization before completing the sound optimization.

Technical Solution

The present invention has been made in an effort to provide a mobile terminal selecting a plurality of level objects predetermined differently for the respective age groups and adjusting sound output according to the level of external noise; and a method for controlling the mobile terminal.

To achieve the technical object above, a mobile terminal according to one embodiment of the present invention comprises a sound output unit; a display unit displaying a plurality of level objects enabling the user to select a frequency gain predetermined according to the user's age in a sound setting mode; a microphone receiving external noise; and a controller outputting through the sound output unit a sound adjusted with a gain obtained as a summation of a gain adjusted in accordance with a selected level object and a gain adjusted in accordance with the level of input noise.

An adjusted sound can correspond to the sound where a gain for each frequency band has been adjusted.

If one of the plurality of level objects is selected, the controller can output the original sound with respect to the adjusted sound and the adjusted sound sequentially.

The controller can output through the sound output unit a sound corresponding to the frequency gain adjusted for a call mode, content play mode, or application execution mode.

The controller can output a sound after automatically adjusting the frequency gain in accordance with the level of the input noise.

The mobile terminal can further comprise a sensing unit which senses one of left and right ear of the user in the vicinity of the sound output unit.

The controller can control the display unit to display a plurality of target objects for adjusting sounds with respect to the left and the right ear separately and output a sound adjusted individually according to one of the left and the right ear through the sound output unit.

The controller can output through the sound output unit a sound corresponding to a frequency gain adjusted individually according to either of the left and the right ear sensed in a call mode, content play mode, or application execution mode.

The mobile terminal can further comprise a sensing unit sensing a distance between the sound output unit and the user, and the controller can output through the sound output unit a sound corresponding to a frequency gain adjusted individually according to a distance sensed in a call mode, content play mode, or application execution mode.

The controller can display a plurality of frequencies with respect to a selected level object and a gain for each frequency band through the display unit and output a sound corresponding to a gain adjusted sequentially for each of frequency bands through the sound output unit.

Meanwhile, a method for controlling a mobile terminal according to one embodiment of the present invention comprises displaying a plurality of level objects for selecting a frequency gain predetermined differently for the respective age group of the user in a sound setting mode; entering external noise; and outputting a sound adjusted with a gain obtained as a summation of a gain adjusted in accordance with the selected level object and a gain adjusted in accordance with the level of input noise.

Advantageous Effects

According to at least one embodiment of the present invention, time for adjusting sound quality can be reduced.

According to at least one embodiment of the present invention, user convenience for adjusting sound quality is secured, and sound quality can be adjusted to be optimized for the user.

The additional application scope of the present invention will be clearly understood from the detailed descriptions given below. However, since various modifications and changes of the present invention can be clearly understood by those skilled in the art within the technical principles and scope of the present invention, it should be understood that detailed descriptions and particular embodiments such as the preferred embodiments of the present invention are provided only as examples.

DESCRIPTION OF DRAWINGS

The accompanying drawings, which are included to provide a further understanding of the invention and are incorporated in and constitute a part of this application, illustrate embodiment(s) of the invention and together with the description serve to explain the principle of the invention.

FIG. 1A is a block diagram of a mobile terminal according to an embodiment;

FIG. 1B is a front perspective view of the mobile terminal according to an embodiment;

FIG. 1C is a rear perspective view of the mobile terminal according to an embodiment;

FIG. 2 is one example of a flow diagram illustrating a method for controlling a mobile terminal according to one embodiment of the present invention;

FIG. 3 is another example of a flow diagram illustrating a method for controlling a mobile terminal according to one embodiment of the present invention;

FIGS. 4 to 6 show various example of a screen related to a sound setting mode of a mobile terminal according to one embodiment of the present invention;

FIG. 7 is one example of a graph related to a gain for each frequency band according to the user age group;

FIG. 8 is one example of a final screen related to a sound setting mode of a mobile terminal according to one embodiment of the present invention;

FIG. 9 is one example of a flow diagram of a method for controlling a mobile terminal according to another embodiment of the present invention;

FIG. 10 is one example of a screen related to a sound setting mode of a mobile terminal according to another embodiment of the present invention;

FIG. 11 is one example of a flow diagram of a method for controlling a mobile terminal according to a yet another embodiment of the present invention;

FIGS. 12 to 13 show various examples of a screen related to a sound setting mode of a mobile terminal according to a yet another embodiment of the present invention; and FIG. 14 shows various sound settings according to ambient noise.

BEST MODE

Arrangements and embodiments may now be described more fully with reference to the accompanying drawings, in which exemplary embodiments may be shown. Embodiments may, however, be embodied in many different forms and should not be construed as being limited to embodiments set forth herein; rather, embodiments may be provided so that this disclosure will be thorough and complete, and will fully convey the concept to those skilled in the art.

A mobile terminal may be described below with reference to the accompanying drawings. In the following description, suffixes "module" and "unit" may be given to components of the mobile terminal in consideration of only facilitation of description and do not have meanings or functions discriminated from each other.

The mobile terminal may include a cellular phone, a smart phone, a laptop computer, a digital broadcasting terminal, personal digital assistants (PDA), a portable multimedia player (PMP), a navigation system and/or so on.

FIG. 1A is a block diagram of a mobile terminal according to an embodiment. Other embodiments, configurations and arrangements may also be provided.

As shown, the mobile terminal 100 may include a wireless communication unit 110 (or radio communication unit), an audio/video (A/V) input unit 120, a user input unit 130, a sensing unit 140, an output unit 150, a memory 160, an interface 170, a controller 180, and a power supply unit 190. The components shown in FIG. 1A may be essential parts and/or a number of components included in the mobile terminal 100 may vary. Components of the mobile terminal 100 may now be described.

The wireless communication unit 110 may include at least one module that enables radio communication between the mobile terminal 100 and a radio communication system or between the mobile terminal 100 and a network in which the mobile terminal 100 is located. For example, the wireless communication unit 110 may include a broadcasting receiving module 111, a mobile communication module 112, a wireless Internet module 113, a short range communication module 114 (or local area communication module), and a location information module 115 (or position information module).

The broadcasting receiving module 111 may receive broadcasting signals and/or broadcasting related information from an external broadcasting management server through a broadcasting channel. The broadcasting channel may include a satellite channel and a terrestrial channel, and the broadcasting management server may be a server that generates and transmits broadcasting signals and/or broadcasting related information or a server that receives previously created broadcasting signals and/or broadcasting related information and transmits the broadcasting signals and/or broadcasting related information to a terminal.

The broadcasting signals may include not only TV broadcasting signals, radio broadcasting signals, and data broadcasting signals but also signals in the form of a combination of a TV broadcasting signal and a radio broadcasting signal. The broadcasting related information may be information on a broadcasting channel, a broadcasting program or a broadcasting service provider, and may be provided even through a mobile communication network. In the latter case, the broadcasting related information may be received by the mobile communication module 112.

The broadcasting related information may exist in various forms. For example, the broadcasting related information may exist in the form of an electronic program guide (EPG) of a digital multimedia broadcasting (DMB) system or in the form of an electronic service guide (ESG) of a digital video broadcast-handheld (DVB-H) system.

The broadcasting receiving module 111 may receive broadcasting signals using various broadcasting systems. More particularly, the broadcasting receiving module 111 may receive digital broadcasting signals using digital broadcasting systems such as a digital multimedia broadcasting-terrestrial (DMB-T) system, a digital multimedia broadcasting-satellite (DMB-S) system, a media forward link only (MediaFLO) system, a DVB-H and integrated services digital broadcast-terrestrial (ISDB-T) systems. The broadcasting receiving module 111 may receive signals from broadcasting systems providing broadcasting signals other than the above-described digital broadcasting systems.

The broadcasting signals and/or broadcasting related information received through the broadcasting receiving module 111 may be stored in the memory 160. The mobile communication module 112 may transmit/receive a radio signal to/from at least one of a base station, an external terminal and a server on a mobile communication network. The radio signal may include a voice call signal, a video telephony call signal or data in various forms according to transmission and reception of text/multimedia messages.

The wireless Internet module 113 may correspond to a module for wireless Internet access and may be included in the mobile terminal 100 or may be externally attached to the mobile terminal 100. Wireless LAN (WLAN or Wi-Fi), wireless broadband (Wibro), world interoperability for microwave access (Wimax), high speed downlink packet access (HSDPA) and so on may be used as a wireless Internet technique.

The short range communication module 114 may correspond to a module for short range communication. Further, BLUETOOTH, radio frequency identification (RFID), infrared data association (IrDA), ultra wideband (UWB) and/or ZigBee may be used as a short range communication technique.

The location information module 115 may confirm or obtain a location or a position of the mobile terminal 100. The location information module 115 may obtain position information by using a global navigation satellite system (GNSS). The GNSS is a terminology describing a radio navigation satellite system that revolves around the earth and transmits reference signals to predetermined types of radio navigation receivers such that the radio navigation receivers can determine their positions on the earth's surface or near the earth's surface. The GNSS may include a global positioning system (GPS) of the United States, Galileo of Europe, a global orbiting navigational satellite system (GLONASS) of Russia, COMPASS of China, and a quasi-zenith satellite system (QZSS) of Japan, for example.

A global positioning system (GPS) module is a representative example of the location information module 115. The GPS module may calculate information on distances between one point or object and at least three satellites and information on a time when distance information is measured and apply trigonometry to the obtained distance information to obtain three-dimensional position information on the point or object according to latitude, longitude and altitude at a predetermined time.

A method of calculating position and time information using three satellites and correcting the calculated position and time information using another satellite may also be used. Additionally, the GPS module may continuously calculate a current position in real time and calculate velocity information using the location or position information.

The A/V input unit 120 may input (or receive) an audio signal and/or a video signal. The A/V input unit 120 may include a camera 121 and a microphone 122. The camera 121 may process image frames of still images or moving images obtained by an image sensor in a video telephony mode or a photographing mode. The processed image frames may be displayed on a display module 151, which may be a touch screen.

The image frames processed by the camera 121 may be stored in the memory 160 or may be transmitted to an external device through the wireless communication unit 110. The mobile terminal 100 may also include at least two cameras 121.

The microphone 122 may receive an external audio signal in a call mode, a recording mode and/or a speech recognition mode, and the microphone 122 may process the received audio signal into electric audio data. The audio data may then be converted into a form that can be transmitted to a mobile communication base station through the mobile communication module 112 and output in the call mode. The microphone 122 may employ various noise removal algorithms (or noise canceling algorithm) for removing or reducing noise generated when the external audio signal is received.

The user input unit 130 may receive input data for controlling operation of the mobile terminal 100 from a user. The user input unit 130 may include a keypad, a dome switch, a touch pad (constant voltage/capacitance), a jog wheel, a jog switch and/or so on.

The sensing unit 140 may sense a current state of the mobile terminal 100, such as an open/close state of the mobile terminal 100, a position of the mobile terminal 100, whether a user touches the mobile terminal 100, a direction of the mobile terminal 100, and acceleration/deceleration of the mobile terminal 100, and the sensing unit 140 may generate a sensing signal for controlling operation of the mobile terminal 100. For example, in an example of a slide phone, the sensing unit 140 may sense whether the slide phone is opened or closed. Further, the sensing unit 140 may sense whether the power supply unit 190 supplies power and/or whether the interface 170 is connected to an external device. The sensing unit 140 may also include a proximity sensor 141 and an illumination sensor 142. The sensing unit 140 may sense a motion of the mobile terminal 100.

The output unit 150 may generate visual, auditory and/or tactile output, and the output unit 150 may include the display module 151, an audio output module 152, an alarm 153 and a haptic module 154. The display module 151 may display information processed by the mobile terminal 100. The display module 151 may display a user interface (UI) and/or a graphic user interface (GUI) related to a telephone call when the mobile terminal 100 is in the call mode. The display module 151 may also display a captured and/or received image, a UI or a GUI when the mobile terminal 100 is in the video telephony mode or the photographing mode.

The display module 151 may include at least one of a liquid crystal display, a thin film transistor liquid crystal display, an organic light-emitting diode display, a flexible display and/or a three-dimensional display. The display module 151 may be of a transparent type or a light transmissive type. That is, the display module 151 may include a transparent display.

The transparent display may be a transparent liquid crystal display. A rear structure of the display module 151 may also be of a light transmissive type. Accordingly, a user may see an object located behind the body (of the mobile terminal 100) through the transparent area of the body of the mobile terminal 100 that is occupied by the display module 151.

The mobile terminal 100 may also include at least two displays 151. For example, the mobile terminal 100 may include a plurality of displays 151 that are arranged on a single face at a predetermined distance or integrated displays. The plurality of displays 151 may also be arranged on different sides.

When the display module 151 and a sensor sensing touch (hereafter referred to as a touch sensor) form a layered structure that is referred to as a touch screen, the display module 151 may be used as an input device in addition to an output device. The touch sensor may be in the form of a touch film, a touch sheet, and/or a touch pad, for example.

The touch sensor may convert a variation in pressure applied to a specific portion of the display module 151 or a variation in capacitance generated at a specific portion of the display module 151 into an electric input signal. The touch sensor may sense pressure of touch as well as position and area of the touch.

When the user applies a touch input to the touch sensor, a signal corresponding to the touch input may be transmitted to a touch controller. The touch controller may then process the signal and transmit data corresponding to the processed signal to the controller 180. Accordingly, the controller 180 may detect a touched portion of the display module 151.

The proximity sensor (of the sensing unit 140) may be located in an internal region of the mobile terminal 100, surrounded by the touch screen, and/or near the touch screen. The proximity sensor may sense an object approaching a predetermined sensing face or an object located near the proximity sensor using an electromagnetic force or infrared rays without having mechanical contact. The proximity sensor may have a lifetime longer than a contact sensor and may thus have a wide application in the mobile terminal 100.

The proximity sensor may include a transmission type photo-electric sensor, a direct reflection type photo-electric sensor, a mirror reflection type photo-electric sensor, a high-frequency oscillating proximity sensor, a capacitive proximity sensor, a magnetic proximity sensor, and/or an infrared proximity sensor. A capacitive touch screen may be constructed such that proximity of a pointer is detected through a variation in an electric field according to the proximity of the pointer. The touch screen (touch sensor) may be classified as a proximity sensor.

For ease of explanation, an action of the pointer approaching the touch screen without actually touching the touch screen may be referred to as a proximity touch and an action of bringing the pointer into contact with the touch screen may be referred to as a contact touch. The proximity touch point of the pointer on the touch screen may correspond to a point of the touch screen at which the pointer is perpendicular to the touch screen.

The proximity sensor may sense the proximity touch and a proximity touch pattern (e.g., a proximity touch distance, a proximity touch direction, a proximity touch velocity, a proximity touch time, a proximity touch position, a proximity touch moving state, etc.). Information corresponding to the sensed proximity touch action and proximity touch pattern may then be displayed on the touch screen.

The audio output module 152 may output audio data received from the wireless communication unit 110 or stored in the memory 160 in a call signal receiving mode, a telephone call mode or a recording mode, a speech recognition mode and a broadcasting receiving mode. The audio output module 152 may output audio signals related to functions, such as a call signal incoming tone and a message incoming tone, performed in the mobile terminal 100. The audio output module 152 may include a receiver, a speaker, a buzzer, and/or the like. The audio output module 152 may output sounds through an earphone jack. The user may hear the sounds by connecting an earphone to the earphone jack.

The alarm 153 may output a signal for indicating generation of an event of the mobile terminal 100. For example, an alarm may be generated when receiving a call signal, receiving a message, inputting a key signal, and/or inputting a touch. The alarm 153 may also output signals in forms different from video signals or audio signals, for example, a signal for indicating generation of an event through vibration. The video signals and/or the audio signals may also be output through the display module 151 or the audio output module 152.

The haptic module 154 may generate various haptic effects that the user can feel. One example of the haptic effects is vibration. An intensity and/or pattern of vibration generated by the haptic module 154 may also be controlled. For example, different vibrations may be combined and output or may be sequentially output.

The haptic module 154 may generate a variety of haptic effects including an effect of stimulus according to an arrangement of pins vertically moving against a contact skin surface, an effect of stimulus according to a jet force or sucking force of air through a jet hole or a sucking hole, an effect of stimulus of rubbing the skin, an effect of stimulus according to contact of an electrode, an effect of stimulus using an electrostatic force, and an effect according to a reproduction of cold and warmth using an element capable of absorbing or radiating heat in addition to vibrations.

The haptic module 154 may not only transmit haptic effects through direct contact but may also allow the user to feel haptic effects through a kinesthetic sense of the user's fingers or arms. The mobile terminal 100 may also include a plurality of haptic modules 154.

The memory 160 may store a program for operations of the controller 180 and/or temporarily store input/output data such as a phone book, messages, still images, and/or moving images. The memory 160 may also store data about vibrations and sounds in various patterns that are output from when a touch input is applied to the touch screen.

The memory 160 may include at least a flash memory, a hard disk type memory, a multimedia card micro type memory, a card type memory, such as SD or XD memory, a random access memory (RAM), a static RAM (SRAM), a read-only memory (ROM), an electrically erasable programmable ROM (EEPROM), a programmable ROM (PROM) magnetic memory, a magnetic disk and/or an optical disk. The mobile terminal 100 may also operate in relation to a web storage that performs a storing function of the memory 160 on the Internet.

The interface 170 may serve as a path to external devices connected to the mobile terminal 100. The interface 170 may receive data from the external devices or power and transmit the data or power to internal components of the mobile terminal 100 or transmit data of the mobile terminal 100 to the external devices. For example, the interface 170 may include a wired/wireless headset port, an external charger port, a wired/wireless data port, a memory card port, a port for connecting a device having a user identification module, an audio I/O port, a video I/O port, and/or an earphone port.

The interface 170 may also interface with a user identification module that is a chip that stores information for authenticating authority to use the mobile terminal 100. For example, the user identification module may be a user identify module (UIM), a subscriber identify module (SIM) and/or a universal subscriber identify module (USIM). An identification device (including the user identification module) may also be manufactured in the form of a smart card. Accordingly, the identification device may be connected to the mobile terminal 100 through a port of the interface 170.

The interface 170 may also be a path through which power from an external cradle is provided to the mobile terminal 100 when the mobile terminal 100 is connected to the external cradle or a path through which various command signals input by the user through the cradle are transmitted to the mobile terminal 100. The various command signals or power input from the cradle may be used as signals for confirming whether the mobile terminal 100 is correctly set in the cradle.

The controller 180 may control overall operations of the mobile terminal 100. For example, the controller 180 may perform control and processing for voice communication, data communication and/or video telephony. The controller 180 may also include a multimedia module 181 for playing multimedia. The multimedia module 181 may be included in the controller 180 or may be separated from the controller 180.

The controller 180 may perform a pattern recognition process capable of recognizing handwriting input or picture-drawing input applied to the touch screen as characters or images. The power supply unit 190 may receive external power and internal power and provide power required for operations of the components of the mobile terminal 100 under control of the controller 180.

According to hardware implementation, embodiments may be implemented using at least one of application specific integrated circuits (ASICs), digital signal processors (DSPs), digital signal processing devices (DSPDs), programmable logic devices (PLDs), field programmable gate arrays (FPGAs), processors, controllers, micro-controllers, microprocessors, and/or electrical units for executing functions. Embodiments may be implemented by the controller 180.

According to software implementation, embodiments such as procedures or functions may be implemented with a separate software module that executes at least one function or operation. Software codes may be implemented according to a software application written in an appropriate software language. The software codes may be stored in the memory 160 and executed by the controller 180.

FIG. 2A is a front perspective view of a mobile terminal (or a handheld terminal) according to an embodiment.

The mobile terminal 100 may be a bar type terminal body. However, embodiments are not limited to a bar type terminal and may be applied to terminals of various types including slide type, folder type, swing type and/or swivel type terminals having at least two bodies that are relatively movably combined.

The terminal body may include a case (a casing, a housing, a cover, etc.) that forms an exterior of the mobile terminal 100. In this embodiment, the case may be divided into a front case 101 and a rear case 102. Various electronic components may be arranged in the space formed between the front case 101 and the rear case 102. At least one middle case may be additionally provided between the front case 101 and the rear case 102.

The cases may be formed of plastics through injection molding or made of a metal material such as stainless steel (STS) or titanium (Ti).

The display module 151, the audio output unit 152, the camera 121, the user input unit 130/131 and 132, the microphone 122 and the interface 170 may be arranged (or provided) in the terminal body, and more specifically may be arranged (or provided) in the front case 101.

The display module 151 may occupy most of the main face of the front case 101. The audio output unit 152 and the camera 121 may be arranged in a region in proximity to one of both ends of the display module 151 and the user input unit 131, and the microphone 122 may be located in a region in proximity to another end of the display module 151. The user input unit 132 and the interface 170 may be arranged (or provided) on sides of the front case 101 and the rear case 102.

The user input unit 130 may receive commands for controlling operation of the mobile terminal 100, and may include a plurality of operating units 131 and 132. The operating units 131 and 132 may be referred to as manipulating portions and may employ any tactile manner in which a user operates the operating units 131 and 132 while having tactile feeling.

The first and second operating units 131 and 132 may receive various inputs. For example, the first operating unit 131 may receive commands such as start, end and scroll and the second operating unit 132 may receive commands such as control of a volume of sound output from the audio output unit 152 or conversion of the display module 151 to a touch recognition mode.

FIG. 2B is a rear perspective view of the mobile terminal (shown in FIG. 2A) according to an embodiment.

Referring to FIG. 2A, a camera 121' may be additionally attached to the rear side of the terminal body (i.e., the rear case 102). The camera 121' may have a photographing direction opposite to that of the camera 121 (shown in FIG. 2A) and may have pixels different from those of the camera 121 (shown in FIG. 2A).

For example, it may be desirable that the camera 121 has low pixels such that the camera 121 may capture an image of a face of a user and transmit the image to a receiving part in case of video telephony while the camera 121' has high pixels because the camera 121' captures an image of a general object and does not immediately transmit the image in many cases. The cameras 121 and 121' may be attached (or provided) to the terminal body such that the cameras 121 and 121' may rotate or pop-up.

A flash bulb 123 and a mirror 124 may be additionally provided in proximity to the camera 121'. The flash bulb 123 may light an object when the camera 121' takes a picture of the object. The mirror 124 may be used for the user to look at his/her face in the mirror when the user wants to self-photograph himself/herself using the camera 121'.

An audio output unit 152' may be additionally provided on the rear side of the terminal body. The audio output unit 152' may achieve a stereo function with the audio output unit 152 (shown in FIG. 2A) and may be used for a speaker phone mode when the terminal is used for a telephone call.

A broadcasting signal receiving antenna may be additionally attached (or provided) to the side of the terminal body in addition to an antenna for telephone calls. The antenna constructing a part of the broadcasting receiving module 111 (shown in FIG. 1A) may be set in the terminal body such that the antenna may be pulled out of the terminal body.

The power supply unit 190 for providing power to the mobile terminal 100 may be set in the terminal body. The power supply unit 190 may be included in the terminal body or may be detachably attached to the terminal body.

A touch pad 135 for sensing touch may be attached to the rear case 102. The touch pad 135 may be of a light transmission type, such as the display module 151. In this example, if the display module 151 outputs visual information through both sides thereof, the visual information may be recognized (or determined) by the touch pad 135. The information output through both sides of the display module 151 may be controlled by the touch pad 135. Otherwise, a display may be additionally attached (or provided) to the touch pad 135 such that a touch screen may be arranged (or provided) even in the rear case 102.

The touch pad 135 may operate in connection with the display module 151 of the front case 101. The touch pad 135 may be located in parallel with the display module 151 behind the display module 151. The touch panel 135 may be identical to or smaller than the display module 151 in size.

FIG. 1B is a front perspective view of a mobile terminal (or a handheld terminal) according to an embodiment.

The mobile terminal 100 may be a bar type terminal body. However, embodiments are not limited to a bar type terminal and may be applied to terminals of various types including slide type, folder type, swing type and/or swivel type terminals having at least two bodies that are relatively movably combined.

The terminal body may include a case (a casing, a housing, a cover, etc.) that forms an exterior of the mobile terminal 100. In this embodiment, the case may be divided into a front case 101 and a rear case 102. Various electronic components may be arranged in the space formed between the front case 101 and the rear case 102. At least one middle case may be additionally provided between the front case 101 and the rear case 102.

The cases may be formed of plastics through injection molding or made of a metal material such as stainless steel (STS) or titanium (Ti).

The display module 151, the audio output unit 152, the camera 121, the user input unit 130/131 and 132, the microphone 122 and the interface 170 may be arranged (or provided) in the terminal body, and more specifically may be arranged (or provided) in the front case 101.

The display module 151 may occupy most of the main face of the front case 101. The audio output unit 152 and the camera 121 may be arranged in a region in proximity to one of both ends of the display module 151 and the user input unit 131, and the microphone 122 may be located in a region in proximity to another end of the display module 151. The user input unit 132 and the interface 170 may be arranged (or provided) on sides of the front case 101 and the rear case 102.

The user input unit 130 may receive commands for controlling operation of the mobile terminal 100, and may include a plurality of operating units 131 and 132. The operating units 131 and 132 may be referred to as manipulating portions and may employ any tactile manner in which a user operates the operating units 131 and 132 while having tactile feeling.

The first and second operating units 131 and 132 may receive various inputs. For example, the first operating unit 131 may receive commands such as start, end and scroll and the second operating unit 132 may receive commands such as control of a volume of sound output from the audio output unit 152 or conversion of the display module 151 to a touch recognition mode.

FIG. 1C is a rear perspective view of the mobile terminal (shown in FIG. 1B) according to an embodiment.

Referring to FIG. 1C, a camera 121b may be additionally attached to the rear side of the terminal body (i.e., the rear case 102). The camera 121b may have a photographing direction opposite to that of the camera 121 (shown in FIG. 1B) and may have pixels different from those of the camera 121 (shown in FIG. 1B).

For example, it may be desirable that the camera 121 has low pixels such that the camera 121 may capture an image of a face of a user and transmit the image to a receiving part in case of video telephony while the camera 121b has high pixels because the camera 121b captures an image of a general object and does not immediately transmit the image in many cases. The cameras 121 and 121b may be attached (or provided) to the terminal body such that the cameras 121 and 121b may rotate or pop-up.

A flash bulb 152b and a mirror 124 may be additionally provided in proximity to the camera 121b. The flash bulb 152b may light an object when the camera 121b takes a picture of the object. The mirror 124 may be used for the user to look at his/her face in the mirror when the user wants to self-photograph himself/herself using the camera 121b.

An audio output unit 122 may be additionally provided on the rear side of the terminal body. The audio output unit 122 may achieve a stereo function with the audio output unit 152a (shown in FIG. 1B) and may be used for a speaker phone mode when the terminal is used for a telephone call.

A broadcasting signal receiving antenna may be additionally attached (or provided) to the side of the terminal body in addition to an antenna for telephone calls. The antenna constructing a part of the broadcasting receiving module 111 (shown in FIG. 1) may be set in the terminal body such that the antenna may be pulled out of the terminal body.

The power supply unit 190 for providing power to the mobile terminal 100 may be set in the terminal body. The power supply unit 190 may be included in the terminal body or may be detachably attached to the terminal body.

A touch pad 135 for sensing touch may be attached to the rear case 102. The touch pad 135 may be of a light transmission type, such as the display module 151. In this example, if the display module 151 outputs visual information through both sides thereof, the visual information may be recognized (or determined) by the touch pad 135. The information output through both sides of the display module 151 may be controlled by the touch pad 135. Otherwise, a display may be additionally attached (or provided) to the touch pad 135 such that a touch screen may be arranged (or provided) even in the rear case 102.

The touch pad 135 may operate in connection with the display module 151 of the front case 101. The touch pad 135 may be located in parallel with the display module 151 behind the display module 151. The touch panel 135 may be identical to or smaller than the display module 151 in size.

In what follows, embodiments of the present invention will be described in more detail.

FIG. 2 is one example of a flow diagram illustrating a method for controlling a mobile terminal 100 according to one embodiment of the present invention.

With reference to FIG. 2, the mobile terminal 100 according to one embodiment of the present invention displays a plurality of level objects S210. More specifically, the controller 180 can display a plurality of level objects for setting sound quality optimized to the user.

At this time, the plurality of level objects can denote the objects meant for receiving a user input according to the age group of the user. In particular, frequency gain for each of the plurality of level objects can be set differently for the age group of the user. Also, the frequency gain can be set separately for each of a plurality of representative frequencies included in the audible frequency band.

Afterwards, the mobile terminal 100 inputs external noise S220. More specifically, the microphone 122 can receive a sound generated from the outside of the mobile terminal 100 or noise.

Afterwards, the mobile terminal 100 outputs an adjusted sound S220. More specifically, the controller 180 outputs a sound adjusted in accordance with a selected level object. For example, if a first level object is selected, the controller 180 can adjust and output a sound according to the gain predetermined by the first level object.

Meanwhile, the controller 180 can output a sound adjusted with a gain obtained as a summation of the gain adjusted in accordance with a selected level object and the gain adjusted in accordance with an input noise level. For example, while the first level object is selected, the controller 180 can extract a gain adjusted in accordance with an input noise level. The controller 180 can obtain a total gain from the gain adjusted in accordance with a selected level object and a gain adjusted in accordance with an input noise level. Therefore, the controller 180 can output a sound adjusted according to the total gain.

FIG. 3 is another example of a flow diagram illustrating a method for controlling a mobile terminal 100 according to one embodiment of the present invention. In what follows, the same description as provided above will be omitted.

With reference to FIG. 3, the mobile terminal 100 displays a sound setting screen. If a sound optimization setting object displayed on the sound setting screen is selected S310, the controller 180 can activate an ear selection object.

Afterwards, if the user selects an ear selection object displayed on the sound setting screen, the controller 180 can display a plurality of target objects with which the user can select either of the left and the right ear. If a target object associated with either of the left and right ear is selected S320, the controller 180 can proceed with sound quality setting to optimize the sound to the ear corresponding to the selected target object.

Afterwards, if a sound quality setting object displayed on the sound setting screen is selected, the controller 180 can display a plurality of level objects. If the user selects one of the plurality of displayed level objects S330, the controller 180 can sequentially output the original sound before sound quality adjustment and the sound whose gain has been adjusted according to the gain predetermined by the selected level object S340.

Afterwards, if sound quality according to the selected level object is selected S350_Y, the controller 180 can adjust and output a sound according to the sound quality predetermined by the selected level object S360. If sound quality according to the selected level object is not selected S350_N, the controller 180 can display the plurality of level objects so that another one from the plurality of displayed level objects can be selected S360.

As a result, sound quality adjusting time can be reduced, and the user convenience for adjusting sound quality can be secured. Also, sound quality can be adjusted to be optimized to the user.

The operation of the mobile terminal 100 as described above will be described in more detail with reference to FIGS. 4 to 8.

FIGS. 4 to 6 show various example of a screen related to a sound setting mode of a mobile terminal 100 according to one embodiment of the present invention.

With reference to FIG. 4(a), a sound setting screen is displayed on the display unit in a sound setting mode. The sound setting screen includes sound quality optimum setting object 210. If the user wants to adjust the quality of a sound output from the mobile terminal 100, the user can select a switching object 211 included in the sound quality optimum setting object 210. In other words, if the switching object 211 is set to setting from release, a screen such as shown in FIG. 4(b) can be displayed.

As can be seen from FIG. 5(a), an ear selection object 212 is activated. In other words, if the switching object 211 changes from release to setting, the ear selection object 212 is activated. The ear selection object 212 can be an object displayed for optimizing sound quality for either of the left and right ear of the user. Therefore, if the ear selection object 212 is selected, a screen as shown in FIG. 5(b) can be displayed.

In this case, the controller 180 can display through the display unit a plurality of target objects 213 for adjusting sounds separately for the left and right ear. In this case, the plurality of target objects 213 may correspond to an object meant for selecting a target of sound optimization from the left and right ear of the user. Therefore, as shown in FIG. 5(b), a plurality of target objects 213 are displayed, and the user can select either of the left and the right ear. If one of the plurality of target objects 213 is selected, sound quality optimization is carried out for the selected ear, and a screen as shown in FIG. 6(a) can be displayed.

As can be seen from FIG. 6(a), a sound quality setting object 214 is activated. In other words, if one of the plurality of target objects 213 is selected, the sound quality setting object 214 can be activated. If the user selects the sound quality setting object 214, a plurality of level objects 215-1~215-3 can be displayed as shown in FIG. 6(b).

At this time, the plurality of level objects 215-1~215-3 can correspond to an object meant for selecting a frequency gain predetermined differently for the age group of the user. As shown in FIG. 6(b), a first to a third level object can be displayed, and a frequency gain can be set differently for each of the level objects according to the age group of the user, which will be described in detail with reference to FIG. 7.

FIG. 7 is one example of a graph related to a gain for each frequency band according to the user's age group. With reference to FIG. 7, the gain is low throughout the whole frequency bands for the users of their twenties, whereas the gain is high throughout the whole frequency bands in the case of user of their eighties. In other words, for most cases, the gain for each frequency band should be set to be low for younger age groups whereas the gain for each frequency band should be set to be high for older age groups so that a sound can be optimized for the users of all ages.

Therefore, the frequency gain according to the age group of the user as shown in FIG. 7 can be set by the plurality of level objects 215-1~215-3. For example, a first level object 215-1 shown in FIG. 6(b) can be used to set an optimal frequency gain for the users of their teens to thirties. A second level object 215-2 can be used to set an optimal frequency gain for the users of their forties to sixties. A third level object 215-3 can be used to set an optimal frequency gain for the users of their seventies.

Meanwhile, although FIG. 6(b) employs the first to the third level object 215-1~215-3 only, the present invention is not limited to the above example. In other words, age group of the user can be more finely divided so that more diverse level objects can be displayed. Therefore, various level objects can be displayed; for example, in case the user is in his or her teens, a first level object can be displayed for setting an optimal frequency gain whereas, in case the user is in his or her nineties, a ninth level object can be introduced to set an optimal frequency gain.

Meanwhile, a user defined value object 215-4 meant for the user to set a frequency gain directly is shown in FIG. 6(b), which will be described in more detail with reference to FIGS. 9 to 10.

One level object matching the user's age group can be selected from among the plurality of level objects 215-1~215-3 shown in FIG. 6(b), and if one level object is selected, the controller 180 can output a sound adjusted in accordance with the selected level object through the sound output unit 152. In this case, the adjusted sound can correspond to the sound where a gain for each frequency band has been adjusted.

Meanwhile, if one of the plurality of level objects 215-1~215-3 shown in FIG. 6(b) is selected, a screen as shown in FIG. 8 can be displayed. FIG. 8 is one example of a final screen related to a sound setting mode of a mobile terminal 100 according to one embodiment of the present invention. With reference to FIG. 8, an original listening object 216-1 and an optimized listening object 216-2 can be displayed.

In this case, the controller 180 can output the original sound with respect to an adjusted sound and the adjusted sound sequentially. In other words, if the original listening object 216-1 is selected, the original sound before optimization of sound quality as described above is not performed can be output. If the optimized listening object 216-2 is selected, an adjusted sound after optimization of sound quality is performed as described above can be output. Therefore, the user can listen to the original sound and the adjusted sound sequentially and can select an application completion object 217 if the user wants to set to the adjusted sound. Therefore the controller can output through the sound output unit 152 a sound corresponding to a frequency gain adjusted for a call mode, content play mode, or application execution mode. For example, even though the sound generated from execution of a recorded file may be used for sound optimization setting, after the sound optimization, the sound at the time of call reception, the sound at the time of content play, and the sound at the time of application execution can be output being adjusted with a frequency gain according to the sound optimization setting.

If the user is not satisfied with the adjusted sound, the user can choose to return to the screen of FIG. 6(b) which is the previous screen of FIG. 8. The means to switch back to the previous screen of a current screen can be implemented by a return button or swiping along one direction, which is well known to the public and will not be described in detail. Therefore, the user can select a different level object from the screen as shown in FIG. 6(b).

Meanwhile, the description about sound optimization has been provided with respect to either of the left and right ear of the user. Therefore, if it is the case that sound optimization has been performed for one ear of the user as described above, sound optimization for the other ear can also be carried out by performing the same step one more time.

Meanwhile, the mobile terminal 100 according to one embodiment of the present invention can include a sensing unit 140, and the sensing unit 140 can sense the user's ear close to the sound output unit 152. In this case, the controller 180 determines the user's ear approaching the sound output unit 152 for the first time when a particular sound is output as the ear of frequent use; if the sensing unit 140 senses movement of the mobile terminal 100, it can be determined that the ear of the opposite side with respect to the ear of frequent use has approached. The sensing unit 140 which senses such movement of the mobile terminal 100 can be implemented by an accelerator, gyroscope, orientation sensor, and so on. Therefore, suppose that the plurality of target objects 213 shown in FIG. 5(b) are intended to select the ear used frequently by the user and sound optimization has been completed as the right ear is selected as the target object 213. In this case, at the time of outputting an adjusted sound, the controller 180 determines the user's ear approaching the sound output unit 152 for the first time as the ear of frequent use, namely, the right ear. Therefore, the controller 180 can output a sound adjusted according to the sound optimization setting. Afterwards, if the user moves the mobile terminal 100 to put the sound output unit 152 to the ear of the opposite side, the controller 180 can output the original sound before adjustment of the sound.

Different from the above, the sensing unit 140 can directly sense one of the left and the right ear of the user close to the sound output unit 152. Therefore, if the sensing unit 140 senses the left ear of the user, the controller 180 can output a sound adjusted in accordance with optimization of sound quality set for the left ear of the user. Likewise, if the sensing unit 180 senses the right ear of the user, the controller 180 can output a sound adjusted in accordance with optimization of sound quality set for the right ear of the user. In other words, the controller 180 can output through the sound output unit 152 a sound corresponding to a frequency gain adjusted individually according to either of the left and right ear sensed in a call mode, content play mode, or application execution mode.

Meanwhile, the sensing unit 140 can sense distance between the sound output unit 152 and the user. In this case, the controller 180 can output through the sound output unit 152 a sound corresponding to a frequency gain adjusted individually according to a distance sensed in a call mode, content play mode, or application execution mode. For example, if the distance d1 between the sound output unit 152 and the user sensed by the sensing unit 140 in the sound optimization setting mode is shorter than the distance d2 between the sound output unit 152 and the user sensed by the sensing unit 140 at the time of outputting a sound adjusted according to sound optimization, sound energy is reduced by the amount of the difference d2−d1 between the two distances. Therefore, the controller 180 can output a sound after increasing the frequency gain of the sound by the amount of the difference d2−d1 between the two distances.

Meanwhile, the controller 180 can output a sound corresponding to the adjusted frequency gain through various forms of sound output units 152. For example, as described above, although the sound optimization setting may be performed with respect to a sound output through a speaker embedded in the mobile terminal 100, a sound with a frequency gain adjusted in accordance with sound optimization can be output even in the case of outputting the sound through earphones, headset, or an external device connected via Bluetooth.

On the other hand, in case the user wants to perform additional sound optimization in addition to the aforementioned sound optimization setting, the user can select one of the hearing test object 217 and the user setting object 218 as shown in FIG. 8. Detailed description of the case where the hearing test object 217 is selected will be provided with reference to FIGS. 11 to 13, and the case where the user setting object 218 is selected will be described in detail with reference to FIGS. 9 to 10.

FIG. 9 is one example of a flow diagram of a method for controlling a mobile terminal 100 according to another embodiment of the present invention. The following description can be applied to the case where the user defined value object 215-4 of FIG. 6(b) is selected and to the case where the user setting object 218 of FIG. 8 is selected.

With reference to FIG. 9, the mobile terminal 100 displays a user setting screen. In other words, if the user setting object 218 of FIG. 8 is selected S910, the controller 180 displays the user setting screen. The user setting screen displays a gain object for each of a plurality of frequency objects and a plurality of frequencies.

Afterwards, the gain is adjusted with respect to each of the plurality of displayed frequency objects S920. In other words, while the plurality of frequency objects are displayed on the display unit, the user can select one of the frequencies at which to perform gain adjustment for optimization of sound quality and adjust the gain with respect to the selected frequency. In this case, the user can adjust again with respect to each of the plurality of displayed frequencies.

Afterwards, the mobile terminal 100 sets a sound quality level according to the adjusted gain S930. More specifically, the controller 180 outputs a sound corresponding to the gain-adjusted frequency object. For example, if the gain of a first frequency object, which is set to 10 dB, is adjusted to 15 dB, the controller 180 can output a sound after adjusting the gain of the first frequency object to 15 dB.

As a result, sound quality adjusting time can be reduced, and the user convenience for adjusting sound quality can be secured. Also, sound quality can be adjusted to be optimized to the user.

The operation of the mobile terminal 100 as described above will be described in more detail with reference to FIG. 10. FIG. 10 is one example of a screen related to a sound setting mode of a mobile terminal 100 according to another embodiment of the present invention.

In this case, the controller 180 can display a plurality of frequencies with respect to a selected level object and a gain for each frequency band through the display unit and output a sound corresponding to a gain adjusted sequentially for each of frequency bands through the sound output unit 152.

With reference to FIG. 10(*a*), a user setting screen is displayed on the display unit of the mobile terminal 100. In other words, in case the user defined value object 215-4 of FIG. 6(*b*) is selected or in case the user setting object 218 of FIG. 8 is selected, the controller 180 can display the user setting screen as shown in FIG. 10(*a*). The user setting screen can be used so that the user can directly set up the gain for each of a plurality of frequencies for sound optimization. Therefore, as shown in FIG. 10(*a*), objects 220~226 corresponding to the respective frequencies belong to the audible frequency range are displayed. Also, the gain currently set up for each of the plurality of frequencies is displayed.

Meanwhile, the plurality of frequencies shown in FIG. 10 belong to the audible frequency range and are samples of representative frequencies; however, the present invention is not limited to the above example. In other words, different frequencies other than those shown in FIG. 10 can be sampled, and the number of samples can be varied.

Meanwhile, the user can adjust a gain by selecting one from among a plurality of displayed frequency objects 220~226. In other words, as shown in FIG. 10(*a*), the user can select one from among the plurality of displayed frequency objects 220~226 by touching the frequency object and adjust the gain by dragging the selected frequency object as much as the amount of desired adjustment. In this case, the controller 180 can display the gain changed according to the amount of dragging in the form of a numeric value or output a sound in proportion to the changed gain through the sound output unit 152.

Meanwhile, the user can adjust the gain for each of the plurality of displayed frequenices, and as a result, a user setting screen as shown in FIG. 10(*b*) can be displayed. Therefore, if the corresponding setting is applied, the controller 180 can output a sound corresponding to the frequency gain adjusted in a call mode, content play mode, or application execution mode through the sound output unit 152.

Meanwhile, the user can perform additional sound optimization in addition to the sound optimization setting as described in FIG. 8, and in what follows, the additional sound optimization will be described. FIG. 11 is one example of a flow diagram of a method for controlling a mobile terminal 100 according to a yet another embodiment of the present invention.

In the final screen of a sound setting mode, a hearing test object 217 is selected S1110. In other words, the user can select the hearing test object 217 to perform the additional sound optimization, where in this case, a hearing test screen is displayed.

Afterwards, the mobile terminal 100 can sense approach of an ear. In other words, the sensing unit 140 can sense the ear approaching the sound output unit 152, and in this case the controller 180 can output a sound for which the gain of the first frequency changes continuously S1120. Therefore, while listening to the sound for which the gain of the first frequency changes continuously, the user can displace the mobile terminal 100 from the ear when the user thinks an optimal sound is output.

Afterwards, the mobile terminal 100 can sense displacement of the ear S1130. More specifically, displacement of the user's ear can be known as the user's ear sensed by the sensing unit 140 is not sensed.

Afterwards, the mobile terminal 100 can determine whether to employ the gain when displacement of the ear is sensed S1140. More specifically, the controller 180 can display a screen meant for the user to determine whether to choose a gain of the first frequency output at the time of displacement of the user's ear as the gain for the first frequency.

At this time, if the user denies setting the gain S1140_N, the controller 180 can again output a sound for which the gain of the first frequency is changed continuously S1120. If the user accepts the setting S1140_Y, the controller 180 sets the gain of the first frequency output when the ear is displaced; if an ear approaching the sound output unit 152 is sensed, the controller 180 can output a sound for which the gain of a second frequency is changed continuously. The description with respect to the first frequency can also be applied to the second frequency.

In other words, if approach of the user's ear is sensed, the controller 180 can output a sound for which the gain with respect to the n-th frequency is changed continuously S1150. In this case, the user can listen to the sound, the gain of which changes continuously with respect to the n-th frequency and displace the user's ear from the mobile terminal 100 when the user thinks an optimal sound is being output.

Therefore, the mobile terminal 100 can sense displacement of the ear S1160 and determine whether to choose the gain when displacement of the ear is sensed S1170, the specific method of which is the same as described above.

As a result, sound quality adjusting time can be reduced, and the user convenience for adjusting sound quality can be secured. Also, sound quality can be adjusted to be optimized to the user.

In this way, additional sound optimization can be carried out, where the operation of the mobile terminal 100 with respect thereto will be described in detail with reference to FIGS. 12 to 13. FIGS. 12 to 13 show various examples of a screen related to a sound setting mode of a mobile terminal 100 according to a yet another embodiment of the present invention.

From the final screen of a sound setting mode as shown in FIG. 8, the user can select a hearing test object 217 to perform additional sound optimization. In this case, a hearing test screen as shown in FIG. 12(*a*) can be displayed. With reference to FIG. 12(*a*), a guide message about a hearing test can be displayed.

Also, if a start object 230 of FIG. 12(*a*) is selected, a hearing test screen as shown in FIG. 12(*b*) can be displayed, and the user can put his or her ear close to the sound output unit 152. If the user's ear approaches the sound output unit 152, the sensing unit 140 can sense the approach of the user's ear. In this case, the controller 180 can output a sound for which the gain with respect to the first frequency from among a plurality of frequencies changes continuously. Also, the controller 180 can switch the display unit to a wait (stand-by) mode, and the display unit in the wait mode can be turned off. In other words, if the user's ear approaching the sound output unit 152 is sensed by the sensing unit 140, the sound output unit 152 can be activated and output a sound for which the gain with respect to the first frequency changes continuously; and the display unit can be deactivated.

Meanwhile, while listening to the sound for which the gain of the first frequency changes continuously, the user can displace the ear from the mobile terminal when the user thinks an optimal sound is output. In this case, the controller 180 can activate the display unit, and a screen such as shown in FIG. 12(b) can be displayed. At this time, if an acceptance object 232 is selected, the controller 180 can set the gain of the first frequency output when the ear is displaced as the gain for the first frequency. If a denial object 231 is selected, the controller 180 can again output a sound for which the gain of the first frequency is changed continuously.

Meanwhile, if approach of the user's ear is sensed after the gain of the first frequency is determined, the controller 180 can output a sound for which the gain for the second frequency is changed continuously, where a method for setting a gain of the second frequency is the same as described above. Therefore, if a gain is determined for each of a plurality of frequencies, a screen as shown in FIG. 13 can be displayed. In this case, if an application object 234 is selected, the sound can be adjusted and output with a gain set for each of the plurality of frequencies. If a re-examination object 233 is selected, a sound for which the gain of the first frequency changes continuously can be again output and sound optimization as described above can be carried out again.

Meanwhile, there are times ambient noise generated when an adjusted sound is output needs to be taken into consideration even if an adjusted sound according to sound optimization as described above is output. FIG. 14 shows various sound settings according to ambient noise, and in what follows, sound optimization in accordance with ambient noise will be described.

A mobile terminal 100 according to various embodiments of the present invention comprise a microphone 122, and the microphone readily picks up noise in addition to an output sound. In this case, the controller 180 can output a sound after automatically adjusting a gain in accordance with an input noise level.

With reference to FIG. 14(a), a frequency gain optimized according to various embodiments of the present invention is displayed, and the controller 180 can output a sound after adjusting the sound according to an optimized frequency gain. However, it should be noted that the microphone 122 can receive noise generated in the surroundings of the mobile terminal 100 when the adjusted sound is output. In this case, the noise may comprise noise except for the adjusted sound output from the sound output unit 152.

Therefore, the controller 180 can automatically adjust the gain in proportion to an input noise level. FIG. 14(b) illustrates a case where a gain is adjusted for each of a plurality of frequencies according to the input, ambient noise. For example, if a first frequency of the ambient noise is 2 dB, the controller 180 can output a sound by increasing the first frequency component 220 of the sound output from the sound output unit 152 by 2 dB. Likewise, if a second frequency of the ambient noise is 2 dB, the controller 180 can output a sound by increasing the second frequency component 221 of the sound output from the sound output unit 152 by 2 dB.

On the other hand, if one analyzes the ambient noise, it can be known that the gain can be varied for each frequency. FIG. 14(c) illustrates a case where a gain is adjusted for each of a plurality of frequencies in accordance with the ambient noise exhibiting varying gain for each frequency. For example, if the first frequency of the ambient noise is 3 dB, the controller 180 can output a sound by increasing the first frequency component 220 of the sound output from the sound output unit 152 by 3 dB. If the second frequency of the ambient noise is 8 dB, the controller 180 can output a sound by increasing the second frequency component 221 of the sound output from the sound output unit 152 by 8 dB. In this way, the controller 180 can obtain a gain for each of a plurality of frequencies included in the input ambient noise and output a sound by adjusting the gain for each frequency component of the sound so that the adjusted gain can correspond to the obtained gain for each of the plurality of frequencies.

As a result, sound quality adjustment can be optimized to the surrounding environment.

The above-described method of controlling the mobile terminal may be written as computer programs and may be implemented in digital microprocessors that execute the programs using a computer readable recording medium. The method of controlling the mobile terminal may be executed through software. The software may include code segments that perform required tasks. Programs or code segments may also be stored in a processor readable medium or may be transmitted according to a computer data signal combined with a carrier through a transmission medium or communication network.

The computer readable recording medium may be any data storage device that can store data that can be thereafter read by a computer system. Examples of the computer readable recording medium may include read-only memory (ROM), random-access memory (RAM), CD-ROMs, DVD±ROM, DVD-RAM, magnetic tapes, floppy disks, optical data storage devices. The computer readable recording medium may also be distributed over network coupled computer systems so that the computer readable code is stored and executed in a distribution fashion.

A mobile terminal may include a first touch screen configured to display a first object, a second touch screen configured to display a second object, and a controller configured to receive a first touch input applied to the first object and to link the first object to a function corresponding to the second object when receiving a second touch input applied to the second object while the first touch input is maintained.

A method may be provided of controlling a mobile terminal that includes displaying a first object on the first touch screen, displaying a second object on the second touch screen, receiving a first touch input applied to the first object, and linking the first object to a function corresponding to the second object when a second touch input applied to the second object is received while the first touch input is maintained.

Any reference in this specification to "one embodiment," "an embodiment," "example embodiment," etc., means that a particular feature, structure, or characteristic described in connection with the embodiment is included in at least one embodiment of the invention. The appearances of such phrases in various places in the specification are not necessarily all referring to the same embodiment. Further, when a particular feature, structure, or characteristic is described in connection with any embodiment, it is submitted that it is within the purview of one skilled in the art to effect such feature, structure, or characteristic in connection with other ones of the embodiments.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

The invention claimed is:

1. A display device, comprising:
   a sound output unit;
   a sensing unit sensing approach and displacement of an ear of a user with respect to the sound output unit;
   a display unit displaying a plurality of level objects enabling the user to select a frequency gain predetermined according to the user's age in a sound setting mode;
   a microphone receiving external noise; and
   a controller configured to:
      cause the sound output unit to output a sound adjusted with a gain obtained as a summation of a gain adjusted in accordance with a selected level object and a gain adjusted in accordance with a level of input noise received via the microphone;
      enter a hearing test mode in response to a user input;
      cause the sound output unit to output the sound in which a gain of a frequency is changed continuously when the approach of the ear is sensed by the sensing unit in the hearing test mode;
      obtain a gain when the displacement of the ear is sensed by the sensing unit during the output of the sound; and
      re-adjust the sound based on the gain obtained when the displacement of the ear is sensed.

2. The mobile terminal of claim 1, wherein the adjusted sound corresponds to a sound where a gain of each frequency band has been adjusted.

3. The mobile terminal of claim 1, wherein, when one of the plurality of level objects is selected, the controller outputs the original sound with respect to the adjusted sound and the adjusted sound sequentially.

4. The mobile terminal of claim 2, wherein the controller outputs through the sound output unit a sound corresponding to the frequency gain adjusted for a call mode, content play mode, or application execution mode.

5. The mobile terminal of claim 4, wherein the controller outputs a sound after automatically adjusting the frequency gain in accordance with the level of the input noise.

6. The mobile terminal of claim 1, wherein the sensing unit senses one of left and right ears of the user in vicinity of the sound output unit.

7. The mobile terminal of claim 6, wherein the controller controls the display unit to display a plurality of target objects for adjusting sounds with respect to the left and the right ear separately and outputs a sound adjusted individually according to one of the left and the right ear through the sound output unit.

8. The mobile terminal of claim 7, wherein the controller outputs through the sound output unit a sound corresponding to a frequency gain adjusted individually according to either of the left and the right ear sensed in a call mode, content play mode, or application execution mode.

9. The mobile terminal of claim 1, wherein the sensing unit senses a distance between the sound output unit and the user, and wherein the controller outputs through the sound output unit a sound corresponding to a frequency gain adjusted individually according to a distance sensed in a call mode, content play mode, or application execution mode.

10. The mobile terminal of claim 1, wherein the controller displays a plurality of frequencies with respect to a selected level object and a gain for each frequency band through the display unit and outputs a sound corresponding to a gain adjusted sequentially for each of frequency bands through the sound output unit.

11. A method for controlling a mobile terminal, comprising:
   displaying, on a display, a plurality of level objects for selecting a frequency gain predetermined differently for a respective age group of a user in a sound setting mode;
   receiving external noise via a microphone;
   outputting, via a sound output unit, a sound adjusted with a gain obtained as a summation of a gain adjusted in accordance with the selected level object and a gain adjusted in accordance with a level of input noise received via the microphone;
   sensing, via a sensing unit, approach and displacement of an ear of the user with respect to the sound output unit;
   entering a hearing test mode in response to a user input;
   outputting the sound in which a gain of a frequency is changed continuously when the approach of the ear is sensed by the sensing unit in the hearing test mode;
   obtaining a gain when the displacement of the ear is sensed by the sensing unit during the output of the sound; and
   re-adjusting the sound based on the gain obtained when the displacement of the ear is sensed.

* * * * *